(12) United States Patent
Nakashiba (10) Patent No.: US 6,778,213 B1
(45) Date of Patent: Aug. 17, 2004

(54) ACTIVE X-Y ADDRESSABLE TYPE SOLID-STATE IMAGE SENSOR AND METHOD OF OPERATING THE SAME

(75) Inventor: Yasutaka Nakashiba, Tokyo (JP)

(73) Assignee: NEC Electronics Corp. (JP)

( * ) Notice: Subject to any disclaimer, the term of this patent is extended or adjusted under 35 U.S.C. 154(b) by 0 days.

(21) Appl. No.: 09/286,082

(22) Filed: Apr. 5, 1999

(30) Foreign Application Priority Data

Apr. 3, 1998 (JP) .......................................... 10-091094

(51) Int. Cl.[7] ................................................ H04N 3/14

(52) U.S. Cl. ....................................... 348/308; 348/302

(58) Field of Search ................................ 348/302, 308, 348/311; 250/208.1; 257/223, 224, 225, 544

(56) References Cited

U.S. PATENT DOCUMENTS

| | | | | |
|---|---|---|---|---|
| 4,628,341 A | * | 12/1986 | Thomas ...................... | 257/338 |
| 5,572,051 A | * | 11/1996 | Arakawa et al. ............ | 257/225 |
| 5,705,837 A | * | 1/1998 | Tanigawa et al. ........... | 257/223 |
| 5,710,446 A | * | 1/1998 | Chi et al. .................... | 257/225 |
| 5,981,932 A | * | 11/1999 | Guerrieri et al. ........ | 250/208.1 |
| 6,208,010 B1 | * | 3/2001 | Nakazato et al. ........... | 257/544 |

FOREIGN PATENT DOCUMENTS

| | | |
|---|---|---|
| JP | 53-91622 | 8/1978 |
| JP | 60-115260 | 6/1985 |
| JP | 63-13582 | 1/1988 |
| JP | 1-91453 | 4/1989 |
| JP | 3-123180 | 5/1991 |
| JP | 4-56273 | 2/1992 |
| JP | 8-279607 | 10/1996 |

OTHER PUBLICATIONS

S.K. Mendis, et al., "A 128 x 128 CMOS Active Pixel Image Sensor for Highly Integrated Imaging Systems", IEDM 93, 1993, pp. 583–586.

(List continued on next page.)

*Primary Examiner*—Ngoc-Yen Vu
*Assistant Examiner*—Luong Nguyen
(74) *Attorney, Agent, or Firm*—Dickstein, Shapiro, Morin & Oshinsky, LLP (57) ABSTRACT

There is provided a solid-state image sensor including a photoelectric transfer section and a CMOS circuit section both formed on a common semiconductor substrate in accordance with a common process, the solid-state image sensor outputting a signal indicative of a variation in potential caused by electric charges generated in the photoelectric transfer section, the solid-state image sensor including (a) a semiconductor substrate having a first electrical conductivity, a first voltage being applied to the semiconductor substrate, (b) a first well layer formed in the semiconductor substrate, the first well layer having a second electrical conductivity and defining a photoelectric transfer section, a second voltage being applied to the first well layer in such a manner that the first well layer is inversely biased relative to the semiconductor substrate, (c) a second well layer formed in the semiconductor substrate, the second well layer having a first electrical conductivity and partially defining a CMOS circuit section, the first voltage being applied to the second well layer, and (d) a third well layer formed in the semiconductor substrate, the third well layer having a second electrical conductivity and partially defining the CMOS circuit section, the second voltage being applied to the third well layer in such a manner that the third well layer is inversely biased relative to the semiconductor substrate. The solid-state image sensor prevents deterioration in MTF (modulation transfer function) which is caused by floating electric charges being trapped in a potential well in a photoelectric transfer section.

2 Claims, 7 Drawing Sheets

OTHER PUBLICATIONS

Nikkei Micro Device, vol. 7, 1997, pp. 120–125.
Japanese Office Action issued Nov. 14, 2000 in a related application with English Translation of relevant portions.
Nikkei Micro–device, Jul., 1997 issue, pp. 120–125.

Japanese translation of Korean Office action issued Jan. 19, 2001 in a related application with English translation of relevant portions.

* cited by examiner

ACTIVE X-Y ADDRESSABLE TYPE SOLID-STATE IMAGE SENSOR AND METHOD OF OPERATING THE SAME

BACKGROUND OF THE INVENTION

1. Field of the Invention

The invention relates to a solid-state image sensor and a method of operating the same, and more particularly to an active X-Y addressable type solid-state image sensor having compatibility with CMOS fabrication process and a method of operating the same.

2. Description of the Related Art

Conventional solid-state image sensors can be grouped into MOS type and CCD type in accordance with a transfer layer for transferring signal charges generated by photoelectric transfer. In particular, CCD type solid-state image sensor has been widely used for VTR integrally including a camera, a digital camera, a fax machine and so on, and is presently being developed for enhancement in performances.

Some of solid-state image sensors have compatibility with a process of fabricating CMOS transistor (hereinafter, such solid-state image sensors are referred to simply as "CMOS sensor", since they are generally so called), as described in IEDM 93, 1993, pp. 583–586, or Nikkei Micro Device, Vol. 7, 1997, pp. 120–125. CMOS sensor has advantages that it can operate with a single power source such as a 5V or 3.3V cell with the result of low power consumption, that it can be fabricated in conventional CMOS fabrication process, namely, it has compatibility with CMOS fabrication process, and that peripheral circuits such as a signal processing circuit can be mounted on a common chip.

Figure 1:
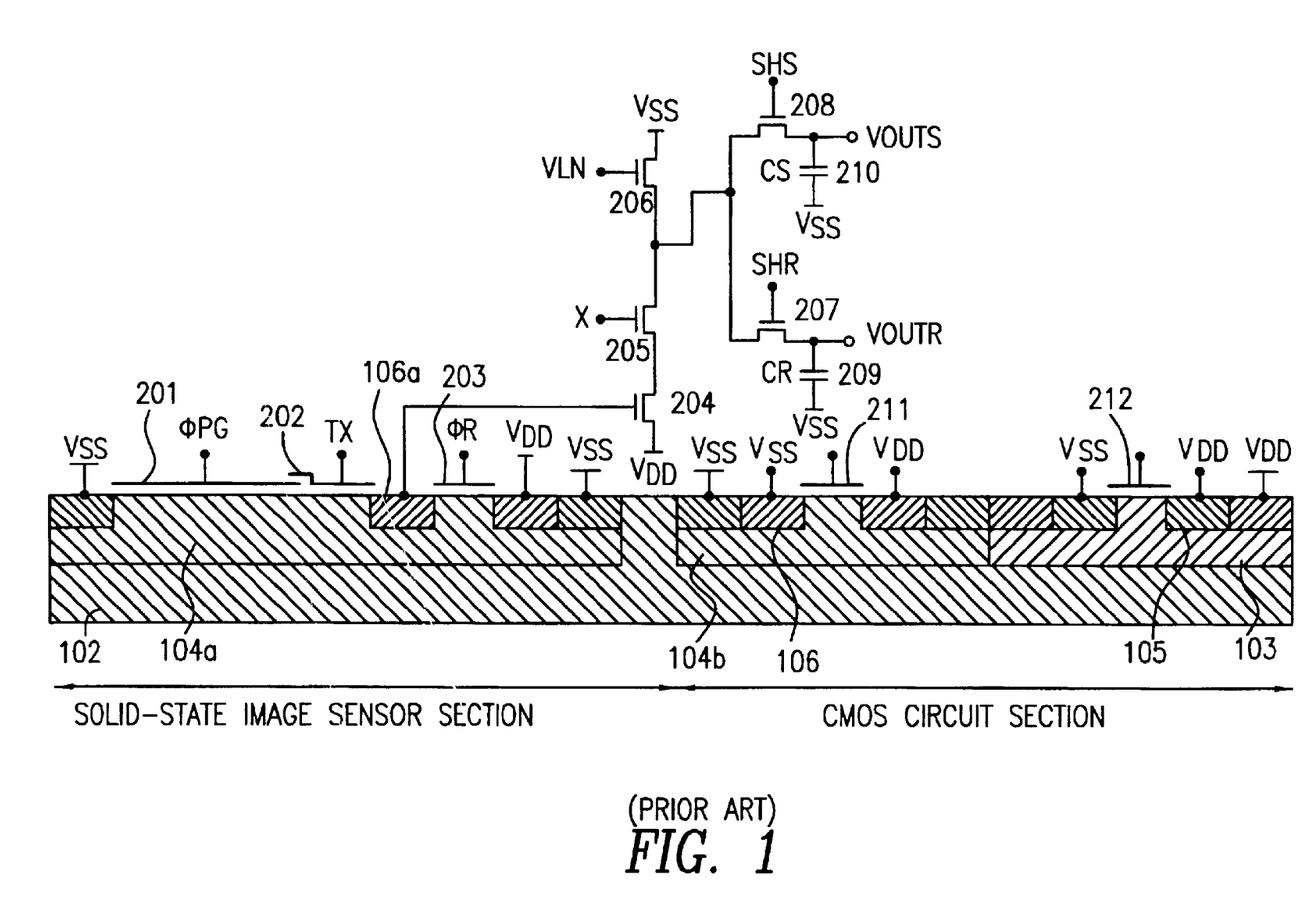
FIG. 1 is a cross-sectional view of a conventional CMOS sensor.
Figure 2:
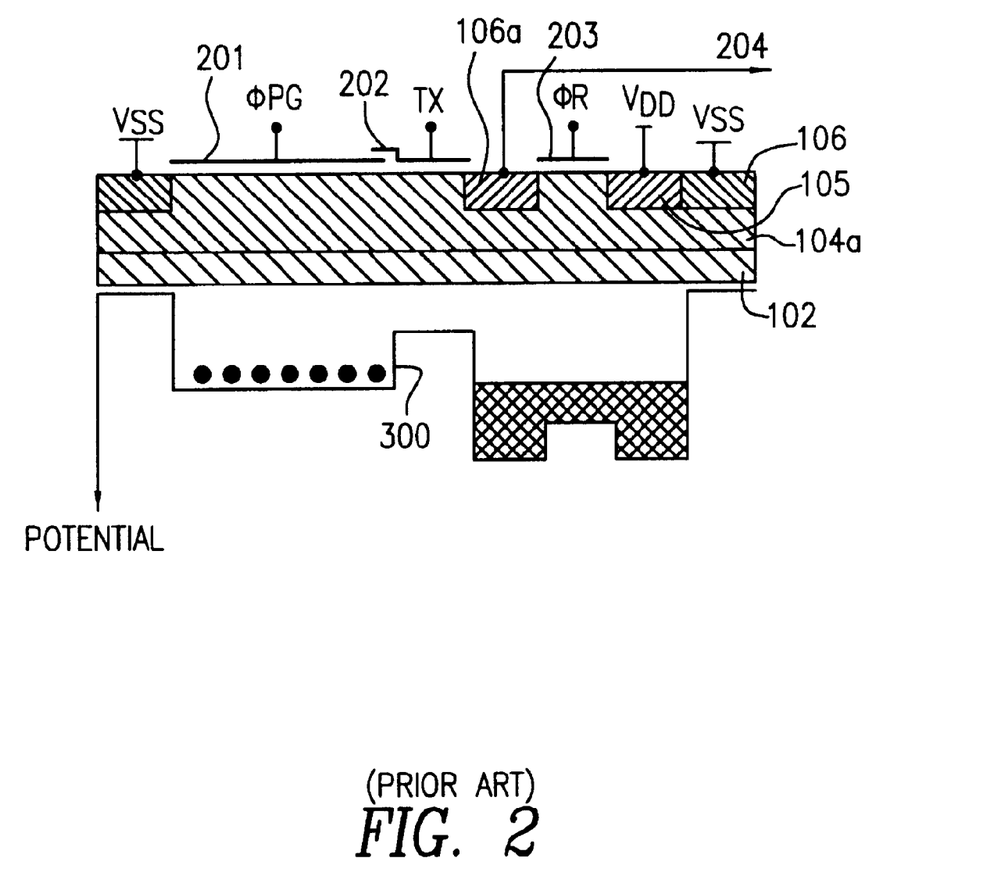
FIG. 2 illustrates a photoelectric transfer section of the conventional CMOS sensor illustrated in FIG. 1 in which electric charges are being accumulated therein.
Figure 3:
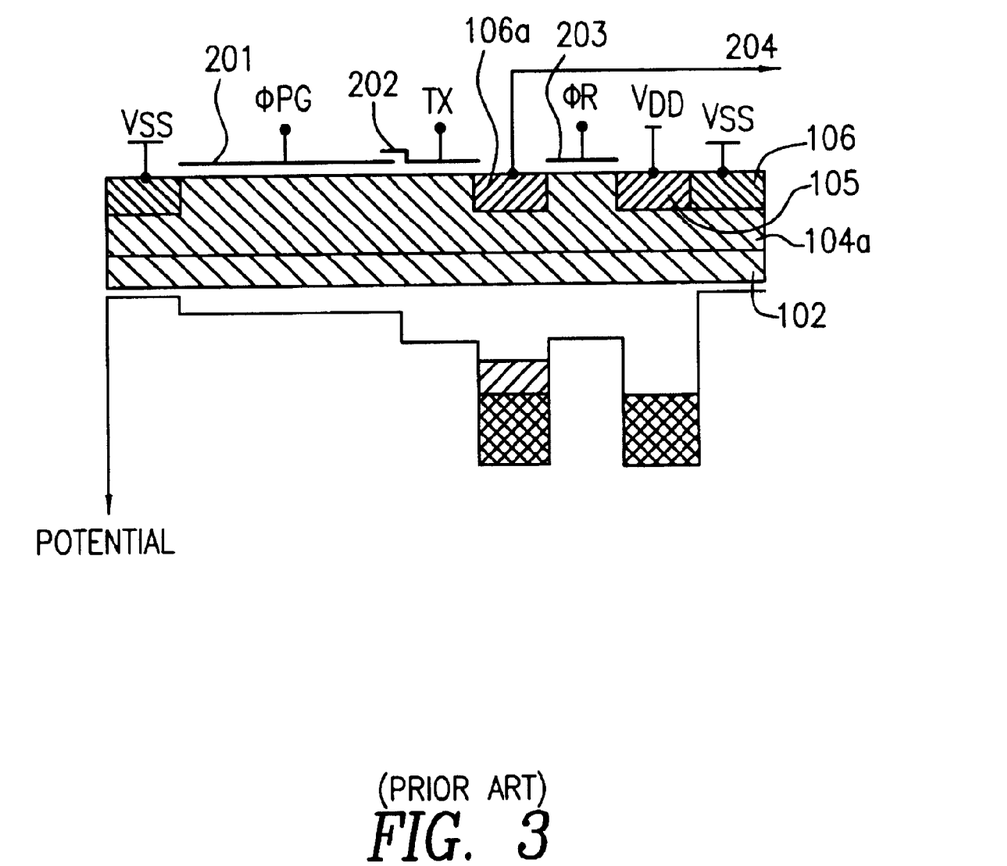
FIG. 3 illustrates a photoelectric transfer section of the conventional CMOS sensor illustrated in FIG. 1 from which the thus accumulated electric charges have been read out.

FIG. 1 is a cross-sectional view of a conventional CMOS sensor. FIG. 2 illustrates a photoelectric transfer section of the conventional CMOS sensor illustrated in FIG. 1 in which electric charges are being accumulated therein, and FIG. 3 illustrates the same photoelectric transfer section from which the thus accumulated electric charges have been read out.

With reference to FIG. 1, the illustrated CMOS sensor is comprised of a p-type semiconductor substrate 102 to which a VSS voltage such as 0V is applied. The p-type semiconductor substrate 102 includes therein a n-type well layer 103 to which a VDD voltage such as 3.3V is applied in such a manner that the n-type well layer 103 is inversely biased relative to the p-type semiconductor substrate 102, first and second p-type well layers 104a and 104b to both of which the VSS voltage is applied, a p+ semiconductor region 105 formed in the n-type well layer 103, a first n+ semiconductor region 106 formed in the second p-type well layer 104b, and a second n+ semiconductor region 106a formed in the first p-type well layer 104a.

Externally of the p-type semiconductor substrate 102 are formed a photo-gate 201 located above an exposed region of the p-type well layer 104a, a first MOSFET 202 connected to the photo-gate 201 for transmitting an output signal, a second MOSFET 203 formed above the p-type well layer 104a for resetting electric charges accumulated in a photoelectric transfer section, a third MOSFET 204 receiving electric charges from the second MOSFET 203 and acting as a source follower amplifier, a fourth MOSFET 205 having a source or drain region to which a source or drain region of the third MOSFET 204 is electrically connected, and acting as a horizontal selection switch, a fifth MOSFET 206 having a source or drain region to which a source or drain region of the fourth MOSFET 205 is electrically connected, and acting as a source follower amplifier and a load, a sixth MOSFET 207 having a source or drain to which a source and a drain of the fourth and fifth MOSFETs 205 and 206 are electrically connected, and transferring dark output, a seventh MOSFET 208 having a source or drain to which a source and a drain of the fourth and fifth MOSFETs 205 and 206 are electrically connected, and transferring bright output, a first capacitor 209 electrically connected to a source or drain of the sixth MOSFET 207 for accumulating dark output therein, a second capacitor 210 electrically connected to a source or drain of the seventh MOSFET 208 for accumulating bright output therein, an n-channel MOSFET 211 formed on an exposed region of the second p-type well region 104b, and a p-channel MOSFET 212 formed on an exposed region of the n-type well layer 103.

In the CMOS sensor, the first p-type well layer 104a located below the photo-gate 201 act as a photoelectric transfer section.

An operation of CMOS sensor having the above-mentioned structure, illustrated in FIG. 1, is explained hereinbelow with reference to FIGS. 1 to 3.

First, a control pulse φ PG which is to be applied to the photo-gate 201 is set to have a high level voltage in order to expand a depletion layer below the photo-gate 201, that is, to deepen a potential below the photo-gate 201. While signal charges are being accumulated, the second n+ semiconductor region 106a which will make a floating diffusion layer is fixed at a source voltage VDD in order to prevent blooming, by setting a control pulse φ R which is to be applied to the second MOSFET 203, to have a high level voltage.

When the p-type semiconductor substrate 102 receives a light, electrons and holes are generated in a region located below the photo-gate 201. The thus generated electrons are accumulated in a depletion layer formed below the photo-gate 201, and the thus generated holes discharged through the first p-type well layer 104a.

As illustrated in FIG. 2, since there is formed a potential barrier 300 caused by the first MOSFET 202 between a depletion layer formed in the first p-type well layer 104a acting as a photoelectric transfer section and the second n+ semiconductor region 106a which will makes a floating diffusion layer, electrons are accumulated below the photo-gate 201 while electric charges are being accumulated.

Then, the control pulse φ R which is to be applied to the second MOSFET 203 is set to have a low level voltage, and the control pulse φ PG which is to be applied to the photo-gate 201 is set to have a low level voltage in order to narrow a depletion layer below the photo-gate 201, that is, to shallow a potential below the photo-gate 201.

As a result, as illustrated in FIG. 3, electrons having been accumulated below the photo-gate 201 are transferred to the floating diffusion layer 106a over the potential barrier 300 formed below the first MOSFET 202. Thus, since electrons are wholly transferred to the floating diffusion layer 106a, after images and noises are not generated in the photoelectric transfer section or first p-type well layer 104a.

Then, a potential of the second n+ semiconductor region 106a is varied in accordance with the number of electrons having been transferred thereto. The variation in the potential of the second n+ semiconductor region 106a is output into the fourth MOSFET 205 acting as a horizontal selection switch through a source of the third MOSFET 204 acting as a source follower amplifier by virtue of source follower operation. Thus, there is obtained photoelectric transfer characteristic having superior linearity.

There is generated kTC noise caused by reset operation in the second n+ semiconductor region or floating diffusion layer 106a. However, such kTC noise can be removed by sampling and accumulating dark output generated prior to transfer of signal electric charges, and calculating a difference between bright output and the thus accumulated dark output.

However, the above-mentioned conventional solid-state image sensor having compatibility with CMOS fabrication process is accompanied with a problem as follows. In the above-mentioned conventional solid-state image sensor, the first p-type well layer 104a defining the photoelectric transfer section is formed in the semiconductor substrate 102 having the same electrical conductivity as that of the first p-type well layer 104a. Hence, there is high probability for floating electric charges to be absorbed into a potential well of the photoelectric transfer section 104a. Accordingly, there is caused a problem that floating electric charges generated through photoelectric transfer in the photoelectric transfer section are diffused, and trapped in a potential well of the photoelectric transfer section with the result of deterioration in modulation transfer function (MTF).

Japanese Unexamined Patent Publication No. 3-123180 has suggested a solid-state image sensor including a photoelectric transfer device for generating signal electric charges associated with an object, a transfer path through which the signal electric charges are transferred, VOD structure acting as an electronic shutter for sweeping out unnecessary electric charges in the photoelectric transfer device in a depthwise direction of a semiconductor substrate in association with a first voltage to be applied to the semiconductor voltage just prior to taking a picture, a transistor having MOS structure and formed on the semiconductor substrate, a circuit for generating a second voltage in synchronization with timing at which the VOD structure sweeps out unnecessary electric charges, and a switch circuit for applying the second voltage to the MOS transistor.

Japanese Unexamined Patent Publication No. 4-56273 has suggested a solid-state image sensor including a light-receiving section formed on a semiconductor substrate, a gate for reading out signal electric charges generated in the light-receiving section, an electric charge transfer section for transferring the thus read-out signal electric charges, transfer electrodes formed above the electric charge transfer section, a light-impermeable layer having a window above the light-receiving section, and an interlayer insulating film sandwiched between the transfer electrodes. The light-impermeable layer and the interlayer insulating film are both comprised of a two-layered structure including a silicon dioxide film and a silicon nitride film.

Japanese Unexamined Patent Publication No. 8-279607 has suggested a method of fabricating a charge coupled device which method is capable of preventing generation of a recess in a potential curve indicative of a potential generated between electrodes in a transfer region. The method includes the steps of forming a p-type well, a n-type buried channel layer, an insulating film, and a first electrode on a n-type semiconductor substrate, forming an n- potential barrier layer by ion-implanting p-type impurities into the semiconductor substrate in a self-aligned fashion with the first electrode being used as a mask, forming an electrically conductive film on both the first electrode and the insulating film, anisotropically etching the electrically conductive film to thereby form an electrically conductive sidewall around the first electrode, thermally oxidizing an upper surface of the first electrode and the sidewall to thereby form a second insulating film, and forming a second electrode on the thus formed second insulating film.

The above-mentioned problem that MTF is deteriorated due to floating electric charges being trapped in a potential well of a photoelectric transfer section is not able to be overcome even by the above-mentioned Publications.

SUMMARY OF THE INVENTION

In view of the above-mentioned problem, it is an object of the present invention to provide a solid-state image sensor having compatibility with CMOS fabrication process which sensor is capable of preventing deterioration in MTF caused by floating electric charges being trapped in a potential well of a photoelectric transfer section.

It is also an object of the present invention to provide a method of operating a solid-state image sensor which method is capable of doing the same.

In one aspect of the present invention, there is provided a solid-state image sensor including a photoelectric transfer section and a CMOS circuit section both formed on a common semiconductor substrate in accordance with a common process, the solid-state image sensor outputting a signal indicative of a variation in potential caused by electric charges generated in the photoelectric transfer section, the solid-state image sensor including (a) a semiconductor substrate having a first electrical conductivity, a first voltage being applied to the semiconductor substrate, (b) a first well layer formed in the semiconductor substrate, the first well layer having a second electrical conductivity and defining a photoelectric transfer section, a second voltage being applied to the first well layer in such a manner that the first well layer is inversely biased relative to the semiconductor substrate, (c) a second well layer formed in the semiconductor substrate, the second well layer having a first electrical conductivity and partially defining a CMOS circuit section, the first voltage being applied to the second well layer, and (d) a third well layer formed in the semiconductor substrate, the third well layer having a second electrical conductivity and partially defining the CMOS circuit section, the second voltage being applied to the third well layer in such a manner that the third well layer is inversely biased relative to the semiconductor substrate.

In accordance with the above-mentioned solid-state image sensor, the well layer having a second electrical conductivity and defining a photoelectric transfer section is formed in a semiconductor substrate having an opposite electrical conductivity to that of the well layer. Hence, it is possible to cause floating electric charges to be effectively absorbed into a potential well formed in a semiconductor substrate below the well layer. Accordingly, floating electric charges generated by virtue of photoelectric transfer in the photoelectric transfer section are trapped in the potential well formed in the semiconductor substrate with the result of enhancement in MTF.

There is further provided a solid-state image sensor including a photoelectric transfer section and a CMOS circuit section both formed on a common semiconductor substrate in accordance with a common process, the solid-state image sensor outputting a signal indicative of a variation in potential caused by electric charges generated in the photoelectric transfer section, the solid-state image sensor including (a) a semiconductor substrate having a first electrical conductivity, a first voltage being applied to the semiconductor substrate, (b) a first well layer formed in the semiconductor substrate, the first well layer having a second electrical conductivity and defining a photoelectric transfer section, a third voltage being applied to the first well layer in such a manner that the first well layer is inversely biased relative to the semiconductor substrate, (c) a second well layer formed in the semiconductor substrate, the second well layer having a first electrical conductivity and partially defining a CMOS circuit section, the first voltage being applied to the second well layer, and (d) a third well layer formed in the semiconductor substrate, the third well layer having a second electrical conductivity and partially defining the CMOS circuit section, a second voltage being applied to the third well layer in such a manner that the third well layer is inversely biased relative to the semiconductor substrate.

It is preferable that a difference between the first and third voltages is greater than a difference between the first and second voltages.

In accordance with the above-mentioned solid-state image sensor, floating electric charges generated by virtue of photoelectric transfer in the photoelectric transfer section are not absorbed into a potential well of the photoelectric transfer section, but are trapped in the potential well formed in the semiconductor substrate with the result of enhancement in MTF, similarly to the firstly mentioned solid-state image sensor.

In addition, since a deeper depletion layer is formed below a photo-gate with the same $\phi$ PG pulse potential as PG pulse potential to be usually applied to a photo-gate, it would be possible to enhance sensitivity of the solid-state image sensor.

There is still further provided a solid-state image sensor including a photoelectric transfer section and a CMOS circuit section both formed on a common semiconductor substrate in accordance with a common process, the solid-state image sensor outputting a signal indicative of a variation in potential caused by electric charges generated in the photoelectric transfer section, the solid-state image sensor including (a) a semiconductor substrate having a first electrical conductivity, a first voltage being applied to the semiconductor substrate, and (b) a well layer formed in the semiconductor substrate, the well layer having a second electrical conductivity and defining a photoelectric transfer section, a second voltage being applied to the well layer in such a manner that the well layer is inversely biased relative to the semiconductor substrate.

In accordance with the above-mentioned solid-state image sensor, floating electric charges generated by virtue of photoelectric transfer in the photoelectric transfer section are not absorbed into a potential well of the photoelectric transfer section, but are trapped in the potential well formed in the semiconductor substrate with the result of enhancement in MTF, similarly to the firstly mentioned solid-state image sensor.

In another aspect of the present invention, there is provided a method of operating a solid-state image sensor including a photoelectric transfer section and a CMOS circuit section both formed on a common semiconductor substrate in accordance with a common process, the method including the steps of (a) applying a first voltage to a semiconductor substrate having a first electrical conductivity, (b) applying a second voltage to a first well layer having a second electrical conductivity and defining a photoelectric transfer section in such a manner that the first well layer is inversely biased relative to the semiconductor substrate, (c) applying the first voltage to a second well layer having a first electrical conductivity and partially defining a CMOS circuit section, and (d) applying the second voltage to a third well layer having a second electrical conductivity and partially defining the CMOS circuit section in such a manner that the third well layer is inversely biased relative to the semiconductor substrate.

There is further provided a method of operating a solid-state image sensor including a photoelectric transfer section and a CMOS circuit section both formed on a common semiconductor substrate in accordance with a common process, the method including the steps of (a) applying a first voltage to a semiconductor substrate having a first electrical conductivity, (b) applying a third voltage to a first well layer having a second electrical conductivity and defining a photoelectric transfer section in such a manner that the first well layer is inversely biased relative to the semiconductor substrate, (c) applying the first voltage to a second well layer having a first electrical conductivity and partially defining a CMOS circuit section, and (d) applying a second voltage to a third well layer having a second electrical conductivity and partially defining the CMOS circuit section in such a manner that the third well layer is inversely biased relative to the semiconductor substrate.

The method may further include the step of defining the first, second and third voltages so that a difference between the first and third voltages is greater than a difference between the first and second voltages.

There is still further provided a method of operating a solid-state image sensor including a photoelectric transfer section and a CMOS circuit section both formed on a common semiconductor substrate in accordance with a common process, the method including the steps of (a) applying a first voltage to a semiconductor substrate having a first electrical conductivity, and (b) applying a second voltage to a well layer in such a manner that the well layer is inversely biased relative to the semiconductor substrate, the well layer being formed in the semiconductor substrate, having a second electrical conductivity, and defining a photoelectric transfer section.

In accordance with the present invention, a well layer having a second electrical conductivity and defining a photoelectric transfer section is formed in a semiconductor substrate having an opposite electrical conductivity to that of the well layer. Hence, it is possible to cause floating electric charges to be effectively absorbed into a potential well formed in a semiconductor substrate below the well layer. Accordingly, floating electric charges generated by virtue of photoelectric transfer in the photoelectric transfer section are trapped in the potential well with the result of enhancement in MTF.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 4:
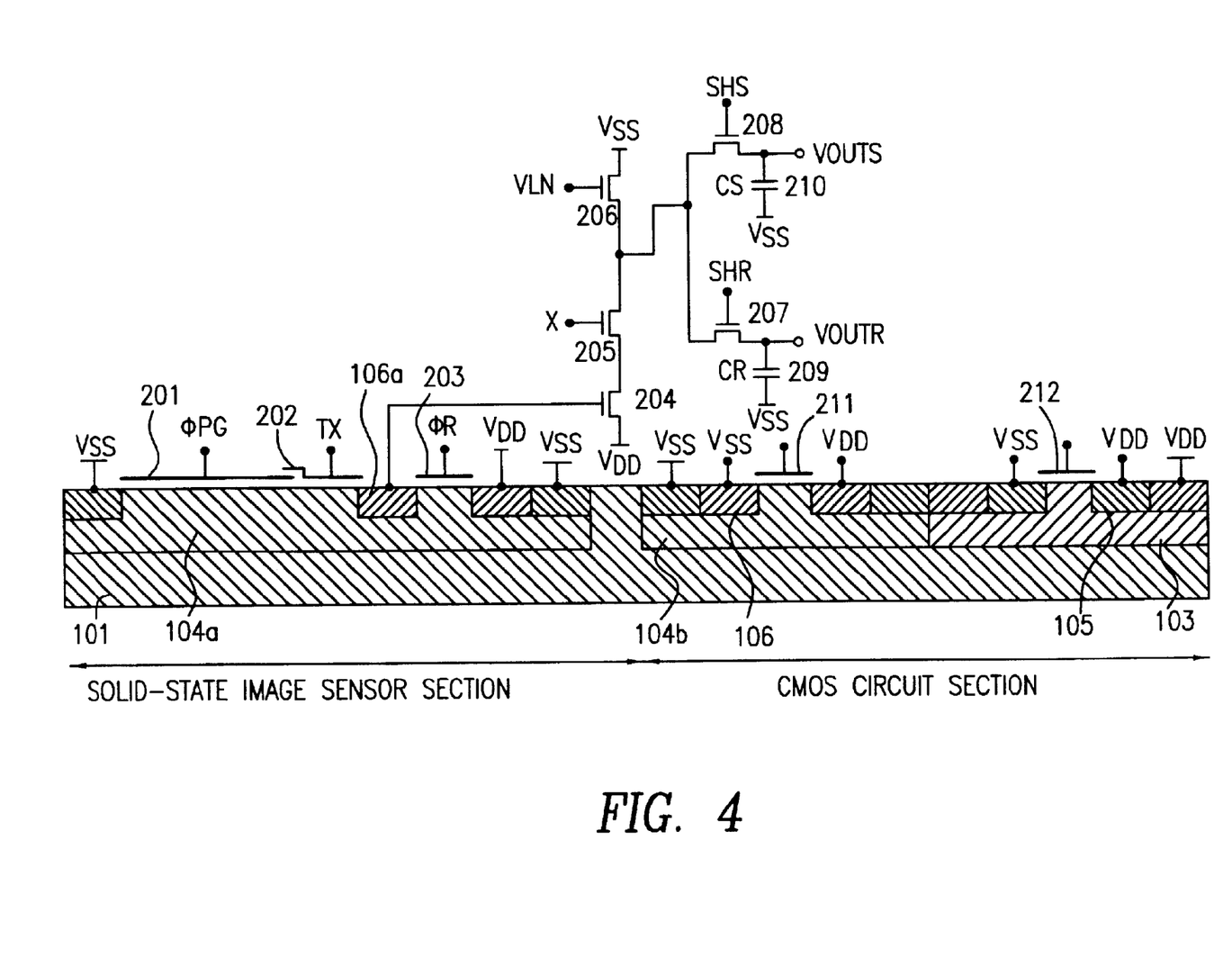
FIG. 4 is a cross-sectional view of a solid-state image sensor in accordance with the first embodiment of the present invention.

FIG. 4 is a cross-sectional view of a solid-state image sensor in accordance with the first embodiment of the present invention.

The solid-state image sensor in accordance with the first embodiment is CMOS sensor, that is, a solid-state image sensor having compatibility with CMOS fabrication process.

With reference to FIG. 4, the solid-state image sensor in accordance with the first embodiment is comprised of an n-type semiconductor substrate 101 to which a VDD voltage such as 3.3V as a first voltage is applied. The n-type semiconductor substrate 101 includes therein a n-type well layer 103 to which a VDD voltage is applied in such a manner that the n-type well layer 103 is inversely biased relative to the n-type semiconductor substrate 101, first and second p-type well layers 104a and 104b to both of which a VSS voltage such as 0V as a second voltage is applied, a p+ semiconductor region 105 formed in the n-type well layer 103, a first n+ semiconductor region 106 formed in the second p-type well layer 104b, and a second n+ semiconductor region 106a formed in the first p-type well layer 104a.

The first p-type well layer 104a defined a photoelectric transfer section, and the second p-type well layer 104b defines a CMOS circuit section. The first and second p-type well layers 104a and 104b have the same structure as each other, and are formed in a common fabrication process.

Externally of the n-type semiconductor substrate 101 are formed a photo-gate 201 located above an exposed region of the first p-type well layer 104a, a first MOSFET 202 connected to the photo-gate 201 for transmitting an output signal, a second MOSFET 203 formed above the first p-type well layer 104a for resetting electric charges accumulated in a photoelectric transfer section, a third MOSFET 204 receiving electric charges from the second MOSFET 203 and acting as a source follower amplifier, a fourth MOSFET 205 having a source or drain region to which a source or drain region of the third MOSFET 204 is electrically connected, and acting as a horizontal selection switch, a fifth MOSFET 206 having a source or drain region to which a source or drain region of the fourth MOSFET 205 is electrically connected, and acting as a source follower amplifier and a load, a sixth MOSFET 207 having a source or drain to which a source and a drain of the fourth and fifth MOSFETs 205 and 206 are electrically connected, and transferring dark output, a seventh MOSFET 208 having a source or drain to which a source and a drain of the fourth and fifth MOSFETs 205 and 206 are electrically connected, and transferring bright output, a first capacitor 209 electrically connected to a source or drain of the sixth MOSFET 207 for accumulating dark output therein, a second capacitor 210 electrically connected to a source or drain of the seventh MOSFET 208 for accumulating bright output therein, an n-channel MOSFET 211 formed on an exposed region of the second p-type well region 104b, and a p-channel MOSFET 212 formed on an exposed region of the n-type well layer 103.

The solid-state image sensor in accordance with the first embodiment is different in structure from the conventional solid-state image sensor illustrated in FIG. 1 with respect to the photoelectric transfer section in that the solid-state image sensor in accordance with the first embodiment includes the n-type semiconductor substrate 101 in place of the p-type semiconductor substrate 102, VDD voltage as the first voltage is applied to the n-type semiconductor substrate 101, and VSS voltage as the second voltage is applied to the first p-type well layer 104a so that the first p-type well layer 104a is inversely biased relative to the n-type semiconductor substrate 101.

The solid-state image sensor in accordance with the first embodiment is different in structure from the conventional solid-state image sensor illustrated in FIG. 1 with respect to CMOS circuit section in that the solid-state image sensor in accordance with the first embodiment includes the n-type semiconductor substrate 101 in place of the p-type semiconductor substrate 102, VDD voltage as the first voltage is applied the first n+ semiconductor region 106, and VSS voltage as the second voltage is applied to the second p-type well layer 104b so that the second p-type well layers 104b is inversely biased relative to the n-type semiconductor substrate 101.

In accordance with the first embodiment, floating electric charges generated by photoelectric transfer in a deep region in the first p-type well layer or photoelectric transfer section 104a are not absorbed into a potential well of the photoelectric transfer section 104a, but absorbed into a potential well of the n-type semiconductor substrate 101, formed below the first p-type well layer or photoelectric transfer section 104a.

Accordingly, unlike the conventional solid-state image sensor illustrated in FIG. 1, deterioration in MTF caused by that floating electric charges generated by photoelectric transfer in the photoelectric transfer section are diffused, and trapped into a potential well formed in the photoelectric transfer section which potential well is located adjacent to the photoelectric transfer section, is not caused.

Second Embodiment

Figure 5:
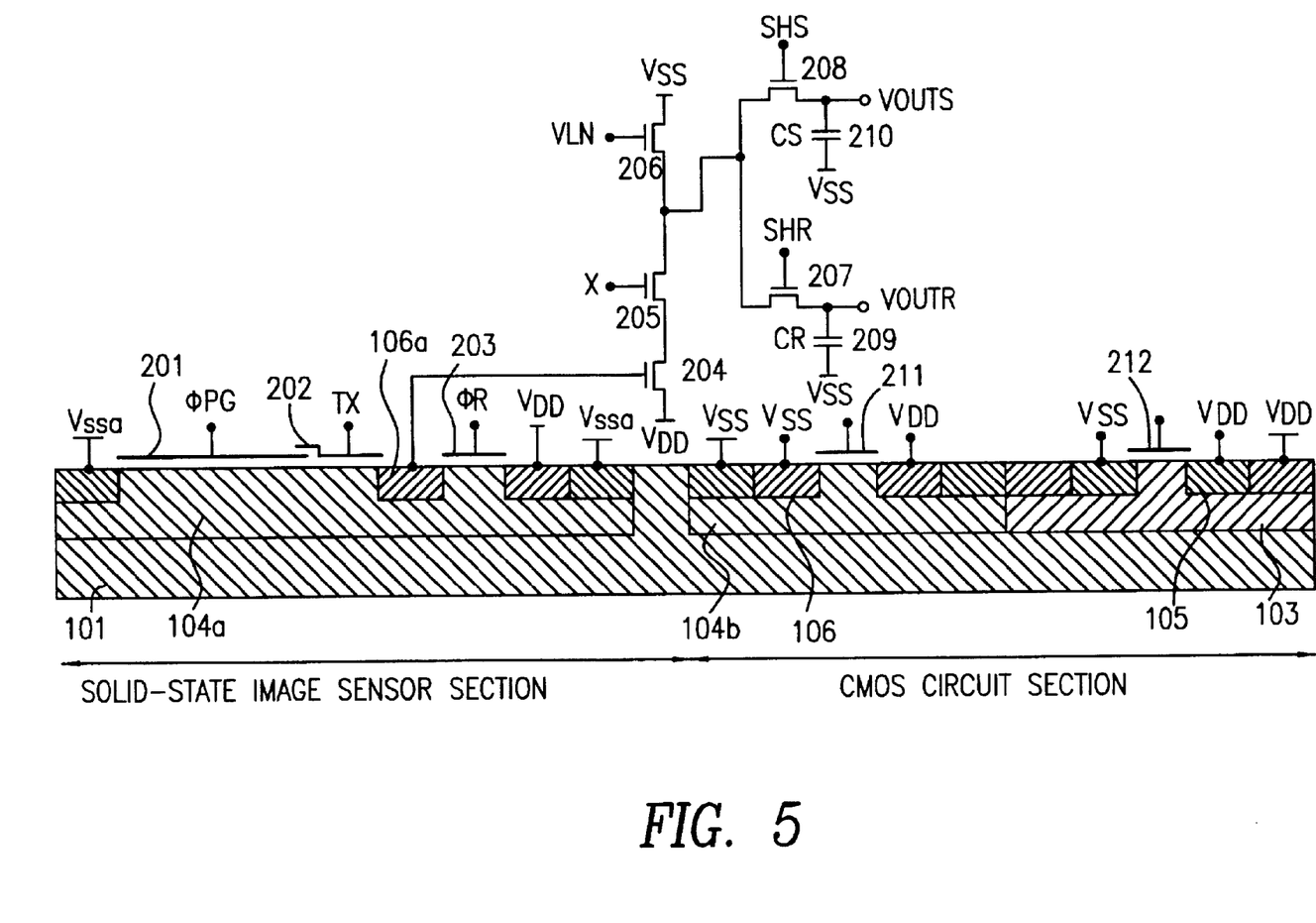
FIG. 5 is a cross-sectional view of a solid-state image sensor in accordance with the second embodiment of the present invention.

FIG. 5 is a cross-sectional view of a solid-state image sensor in accordance with the second embodiment of the present invention.

The solid-state image sensor in accordance with the second embodiment is CMOS sensor, that is, a solid-state image sensor having compatibility with CMOS fabrication process, similarly to the first embodiment.

With reference to FIG. 5, the solid-state image sensor in accordance with the second embodiment is comprised of an n-type semiconductor substrate 101 to which a VDD voltage such as 3.3V as a first voltage is applied. The n-type semiconductor substrate 101 includes therein a n-type well layer 103 to which a VDD voltage is applied in such a manner that the n-type well layer 103 is inversely biased relative to the n-type semiconductor substrate-101, a first p-type well layer 104a to which a VSSa voltage such as −3.3V as the third voltage is applied, a second p-type well layer 104b to which a VSS voltage such as 0V as a second voltage is applied, a p+ semiconductor region 105 formed in the n-type well layer 103, a first n+ semiconductor region 106 formed in the second p-type well layer 104b, and a second n+ semiconductor region 106a formed in the first p-type well layer 104a.

The first p-type well layer 104a defined a photoelectric transfer section, and the second p-type well layer 104b defines a CMOS circuit section. The first and second p-type well layers 104a and 104b have the same structure as each other, and are formed in a common fabrication process.

Externally of the n-type semiconductor substrate 101 are formed a photo-gate 201 located above an exposed region of the first p-type well layer 104a, a first MOSFET 202 connected to the photo-gate 201 for transmitting an output signal, a second MOSFET 203 formed above the first p-type well layer 104a for resetting electric charges accumulated in a photoelectric transfer section, a third MOSFET 204 receiving electric charges from the second MOSFET 203 and acting as a source follower amplifier, a fourth MOSFET 205 having a source or drain region to which a source or drain region of the third MOSFET 204 is electrically connected, and acting as a horizontal selection switch, a fifth MOSFET 206 having a source or drain region to which a source or drain region of the fourth MOSFET 205 is electrically connected, and acting as a source follower amplifier and a load, a sixth MOSFET 207 having a source or drain to which a source and a drain of the fourth and fifth MOSFETs 205 and 206 are electrically connected, and transferring dark output, a seventh MOSFET 208 having a source or drain to which a source and a drain of the fourth and fifth MOSFETs 205 and 206 are electrically connected, and transferring bright output, a first capacitor 209 electrically connected to a source or drain of the sixth MOSFET 207 for accumulating dark output therein, a second capacitor 210 electrically connected to a source or drain of the seventh MOSFET 208 for accumulating bright output therein, an n-channel MOSFET 211 formed on an exposed region of the second p-type well region 104b, and a p-channel MOSFET 212 formed on an exposed region of the n-type well layer 103.

The solid-state image sensor in accordance with the second embodiment is different in structure from the solid-state image sensor in accordance with the first embodiment only in that VSSa voltage as the third voltage in place of VSS voltage as the second voltage is applied to the first p-type well layer or photoelectric transfer section 104a.

Herein, the third or VSSa voltage is defined in such a way that a difference between the first or VDD voltage to be applied to the n-type semiconductor substrate 101 and the third or VSSa voltage to be applied to the first p-type well layer or photoelectric transfer section 104a is greater than a difference between the first or VDD voltage and the second or VSS voltage to be applied to the second p-type well layer 104b.

In accordance with the second embodiment, floating electric charges generated by virtue of photoelectric transfer in the first p-type well layer or photoelectric transfer section 104a are not absorbed into a potential well of the photoelectric transfer section 104a, but absorbed into a potential well of the n-type semiconductor substrate 101, formed below the first p-type well layer or photoelectric transfer section 104a.

In addition, since a deeper depletion layer is formed below the photo-gate 201 by applying the PG pulse potential used in the first embodiment to the photo-gate 201, it would be possible to enhance sensitivity of the solid-state image sensor.

Third Embodiment

Figure 6:
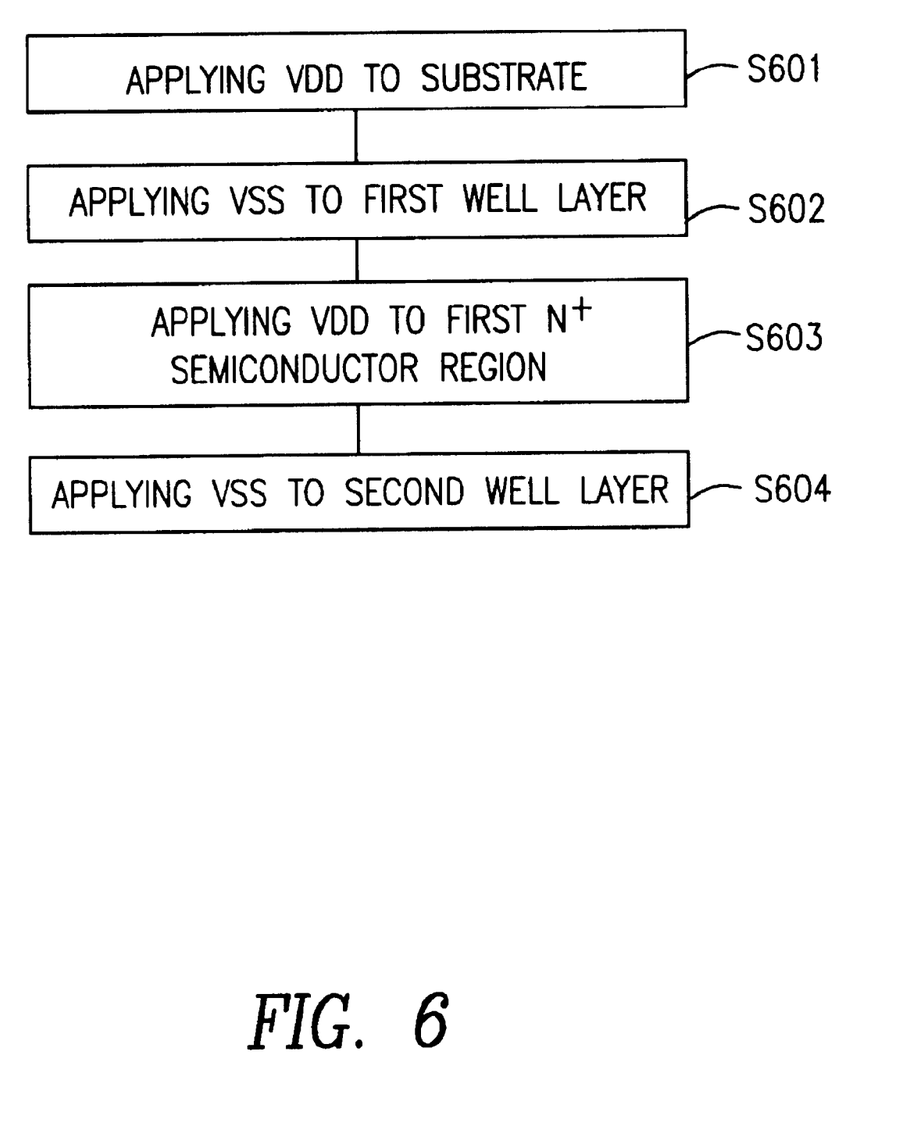
FIG. 6 is a flow chart of a method in accordance with the third embodiment of the present invention.

FIG. 6 is a flow chart showing respective steps of a method of operating a solid-state image sensor. In the instant embodiment, the solid-state image sensor in accordance with the above-mentioned first embodiment is to be operated by the method.

With reference to FIG. 6, the first or VDD voltage is applied to n-type semiconductor substrate 101 in step 601.

Then, applying the second or VSS voltage to the first p-type well layer 104a so that the first p-type well layer 104a is inversely biased relative to the n-type semiconductor substrate 101, in step 602.

Then, the first or VDD voltage is applied to the first n+ semiconductor region 106 in step 603.

Then, the second or VSS voltage is applied to the second well layer 104b in step 604 so that the second well layer 104b is inversely biased relative to the n-type semiconductor substrate 101.

An order for carrying out the steps 601 to 604 is not to be limited to the above-mentioned order. For instance, all the steps 601 to 604 may be carried out at the same time. As an alternative, the steps 601 and 603 may be first carried out at the same time, and then, the steps 602 and 604 may be carried out at the same time.

The method in accordance with the third embodiment provides the same advantage as the advantage obtained by the first embodiment. Namely, in accordance with the third embodiment, floating electric charges generated by photoelectric transfer in the first p-type well layer or photoelectric transfer section 104a are not absorbed into a potential well of the photoelectric transfer section 104a, but absorbed into a potential well of the n-type semiconductor substrate 101, formed below the first p-type well layer or photoelectric transfer section 104a.

Accordingly, unlike the conventional solid-state image sensor illustrated in FIG. 1, deterioration in MTF caused by that floating electric charges generated by photoelectric transfer in the photoelectric transfer section are diffused, and trapped into a potential well formed in the photoelectric transfer section which potential well is located adjacent to the photoelectric transfer section, is not caused.

Fourth Embodiment

Figure 7:
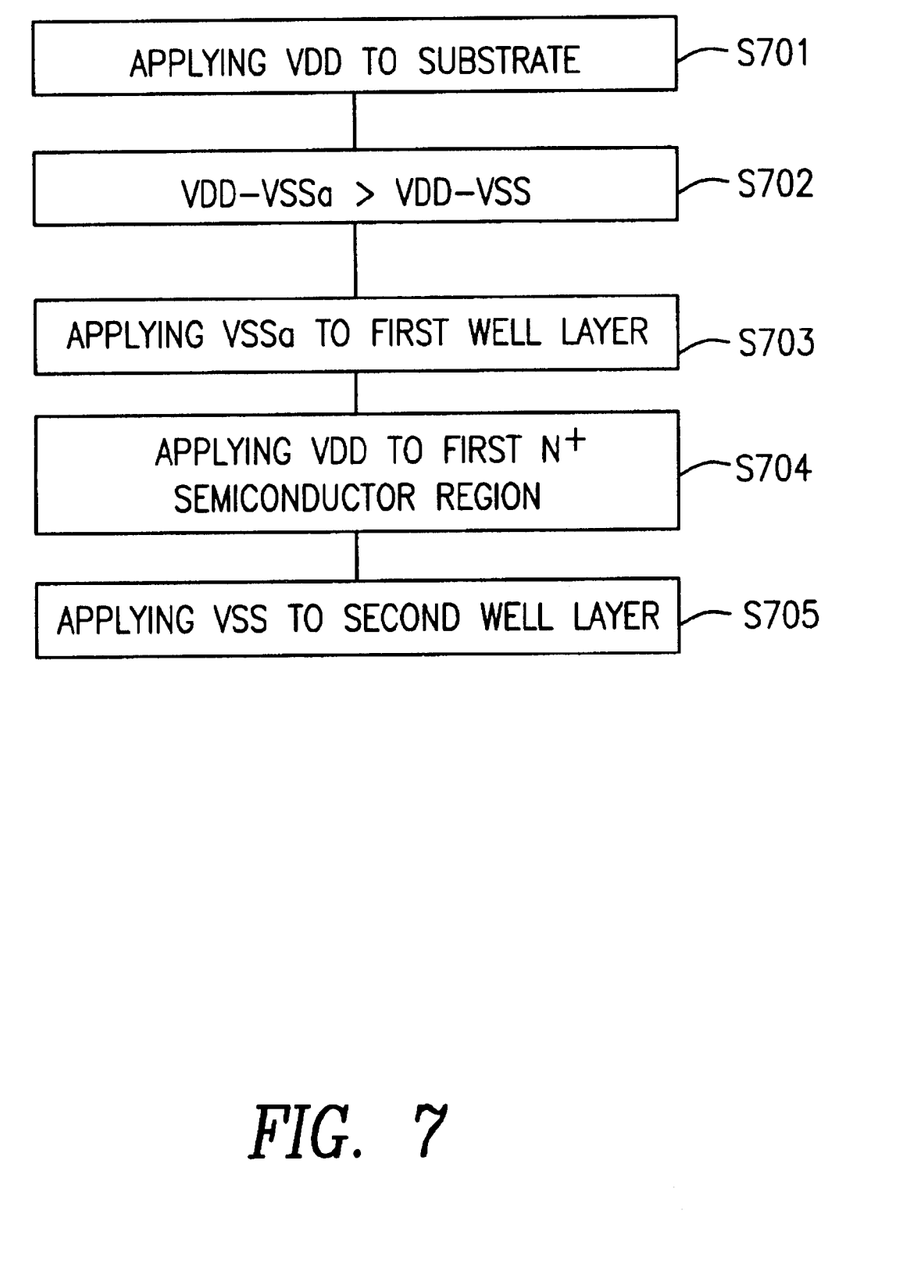
FIG. 7 is a flow chart of a method in accordance with the fourth embodiment of the present invention.

FIG. 7 is a flow chart showing respective steps of a method of operating a solid-state image sensor. In the instant embodiment, the solid-state image sensor in accordance with the above-mentioned second embodiment is to be operated by the method.

With reference to FIG. 7, the first or VDD voltage is applied to n-type semiconductor substrate 101 in step 701.

Then, the first, second and third voltages or VDD, VSS and VSSa voltages are defined in step 702 so that the following equation is established.

$$VDD-VSSa > VDD-VSS$$

Then, applying the third or VSSa voltage to the first p-type well layer 104a so that the first p-type well layer 104a is inversely biased relative to the n-type semiconductor substrate 101, in step 703.

Then, the first or VDD voltage is applied to the first n+ semiconductor region 106 in step 704.

Then, the second or VSS voltage is applied to the second well layer 104b in step 705 so that the second well layer 104b is inversely biased relative to the n-type semiconductor substrate 101.

An order for carrying out the steps 701 to 404 is not to be limited to the above-mentioned order. For instance, the step 702 may be first carried out, and then the steps 701, 703, 704 and 705 may be carried out at the same time. As an alternative, the step 702 may be first carried out, then the steps 701 and 704 may be carried out at the same time, and then, the steps 703 and 705 may be carried out in this order.

The method in accordance with the fourth embodiment provides the same advantage as the advantage obtained by the second embodiment.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-91094 filed on Apr. 3, 1998 including specification, claims, drawings and summary is incorporated herein by reference in its entirety.

What is claimed is:

1. A solid-state image sensor including a photoelectric transfer section and a CMOS circuit section both formed on a common semiconductor substrate in accordance with a common process, said solid-state image sensor outputting a signal indicative of a variation in potential caused by electric charges generated in said photoelectric transfer section, said solid-state image sensor comprising:

(a) a semiconductor substrate having a first electrical conductivity, a first voltage being applied to said semiconductor substrate;

(b) a first well layer formed in said semiconductor substrate, said first well layer having a second electrical conductivity and defining photoelectric transfer section, a second voltage being applied to said first well layer in such a manner that said first well layer is inversely biased relative to said semiconductor substrate;

(c) a second well layer formed in said semiconductor substrate, said second well layer having a first electrical conductivity and partially defining a CMOS circuit section, said second well layer having a junction with said semiconductor substrate, said first voltage being applied to said second well layer; and (d) a third well layer having a second electrical conductivity and partially defining said CMOS circuit section, said second voltage being applied to said third well layer in such a manner that said third well layer is inversely biased relative to said semiconductor substrate, said third well layer having the same concentration profile as that of said first well layer, and having a junction with said semiconductor substrate.

2. A solid-state image sensor including a photoelectric transfer section and a CMOS circuit section both formed on a common semiconductor substrate in accordance with a common process, said solid-state image sensor outputting a signal indicative of a variation in potential caused by electric charges generated in said photoelectric transfer section, said solid-state image sensor comprising:

(a) a semiconductor substrate having a first electrical conductivity, a first voltage being applied to said semiconductor substrate;

(b) a first well layer formed in said semiconductor substrate, said first well layer having a second electrical conductivity and defining photoelectric transfer section, a third voltage being applied to said first well layer in such a manner that said first well layer is inversely biased relative to said semiconductor substrate;

(c) a second well layer formed in said semiconductor substrate, said second well layer having a first electrical conductivity and partially defining a CMOS circuit section, said second well layer having a junction with said semiconductor substrate, said first voltage being applied to said second well layer;

(d) a third well layer having a second electrical conductivity and partially defining said CMOS circuit section, a second voltage being applied to said third well layer in such a manner that said third well layer is inversely biased relative to said semiconductor substrate, said third well layer having the same concentration profile as that of said first well layer, and having a junction with said semiconductor substrate; and a difference between said first and third voltages being greater than a difference between said first and second voltages.

* * * * *